(12) United States Patent
Koch et al.

(10) Patent No.: US 6,906,326 B2
(45) Date of Patent: Jun. 14, 2005

(54) QUANTUM DOT INFRARED PHOTODETECTOR FOCAL PLANE ARRAY

(75) Inventors: Frederick E. Koch, Manchester, NH (US); Joseph G. Pellegrino, Lakeridge, VA (US); Kambiz Alavi, Hollis, NH (US)

(73) Assignee: BAE Systems Information and Elecronic Systems Integration Inc., Nashua, NH (US)

( * ) Notice: Subject to any disclaimer, the term of this patent is extended or adjusted under 35 U.S.C. 154(b) by 87 days.

(21) Appl. No.: 10/627,460

(22) Filed: Jul. 25, 2003

(65) Prior Publication Data

US 2005/0017176 A1 Jan. 27, 2005

(51) Int. Cl.[7] .................................................. G01J 5/20
(52) U.S. Cl. .................................................. 250/338.4
(58) Field of Search ........................ 250/338.4; 257/21, 257/440

(56) References Cited

U.S. PATENT DOCUMENTS

| | | | |
|---|---|---|---|
| 6,054,718 A | * | 4/2000 | Dodd et al. .................... 257/10 |
| 6,124,974 A | | 9/2000 | Burger |
| 6,239,449 B1 | | 5/2001 | Fafard et al. |
| 6,420,728 B1 | * | 7/2002 | Razeghi ........................ 257/14 |
| 6,445,000 B1 | | 9/2002 | Masalkar et al. |
| 6,614,086 B2 | * | 9/2003 | Kim et al. .................... 257/438 |
| 6,642,537 B1 | * | 11/2003 | Gunapala et al. .............. 257/21 |
| 2001/0028055 A1 | * | 10/2001 | Fafard et al. .................. 257/17 |

OTHER PUBLICATIONS

Sarney, W.L. et al. ,"The Microstructural Characterization Of Quantum Dot Superlattices Grown For Infrared Detector Applications", Sensors & Electron Devices Directorate.U.S, Army Research Laboratory, Adelphi, MD.

* cited by examiner

*Primary Examiner*—David Porta
*Assistant Examiner*—Faye Polyzos
(74) *Attorney, Agent, or Firm*—Maine & Asmus

(57) ABSTRACT

Techniques using QDIP technology to form imaging focal plane arrays capable of sensing one or more colors are disclosed. Hybridizing such QDIP arrays to supporting electronic circuitry (e.g. such as CMOS read-out circuitry) enables the generation of an IR image that could be used for applications such as surveillance, night vision, and search and rescue operations.

20 Claims, 4 Drawing Sheets

QUANTUM DOT INFRARED PHOTODETECTOR FOCAL PLANE ARRAY

FIELD OF THE INVENTION

The invention relates to quantum dot technology, and more particularly, to a quantum dot infrared photodetector focal plane array and manufacturing process.

BACKGROUND OF THE INVENTION

A quantum dot infrared photodetector (QDIP) is a device that can detect infrared radiation. The detection of radiation is based on quantum mechanical principles that describe the absorption and radiation of light from atoms and molecules. A quantum dot (QD) is a defect purposely grown in a crystal structure (typically in some III–V semiconducting material such as InAs/GaAs structures). The defect is approximately the size of the wavelength of an electron in the crystal ($\leq 100$ nm).

The QD creates a 3-d localized attractive potential herein referred as a potential hole. Since the electrons are confined in 3-d to the QD whose size is of the order of the electron wavelength, electrons will have discrete energy levels, similar to discrete energy levels of an electron in an atom. The magnitude and spacing of these energy levels is a sensitive function of the dot and the magnitude of the attractive potential energy "potential hole." Thus, by controlling the size and potential of the QD (through appropriate crystal growth techniques), one can create QDs sensitive to different wavelengths of light (colors). Photons incident on the crystal structure with the QDs will be absorbed if they have the energy (wavelength) corresponding to the separation of the ground and first excited energy state (it is possible to excite electrons into higher order states, but has a lower probability of occurrence). An electric field applied to the QDs sweeps the excited electrons off of the dot, and the change in current is measured thereby detecting the light.

What is currently needed are techniques for employing QDIP technology in focal plane array applications, where one or more colors can be detected. In addition, techniques for hybridizing QDIP arrays to supporting electronic circuitry (e.g., such as CMOS read-out circuitry) are needed.

BRIEF SUMMARY OF THE INVENTION

One embodiment of the present invention provides a quantum dot infrared photodetector focal plane array (QDIP FPA) for generating infrared images. The device includes a first stack of quantum dot epi growths sensitive to a first color, a second stack of quantum dot epi growths sensitive to a second color, and a read-out circuit. The read-out circuit is adapted to correlate electrical signals produced by the each of the quantum dot epi growths to intensity of sensed light, thereby allowing for the generation of infrared images.

In one such embodiment, the first and second quantum dot epi growths are part of a structure formed separately from the read-out circuit, the structure grown on a substrate that was subsequently removed to enable improved imaging capability. The separately formed structure can be bump-bonded to the read-out circuit. Note that the device may further include N additional quantum dot epi growths, with each additional quantum dot growth adapted to sense a unique color, and to provide its output to the read-out circuit. In one case, the first quantum dot epi growth is positively biased with respect to the array common, while the second quantum dot epi growth is negatively biased with respect to the array common.

Another embodiment of the present invention provides a QDIP FPA for generating infrared images. This particular device includes the following: a first contact layer having a metal contact on its surface; a first barrier layer on the surface of the first contact layer having the metal contact; a doped quantum dot layer on the first barrier layer, the doped quantum dot layer configured with a plurality of quantum dots, each dot having a size that is sensitive to a first color; a second barrier layer on the doped quantum dot layer; a second contact layer on the second barrier layer, the second contact layer having a metal contact on its surface; and a read-out circuit that is electrically coupled to each of the metal contacts and adapted to correlate electrical signals produced by the doped quantum dot layer to intensity of sensed light, thereby allowing for the generation of infrared images. Note that the first barrier layer, the doped quantum dot layer, and the second barrier layer can be repeated a number of times prior to adding the second contact layer. The device can be fabricated, for example, using both epi-growth processing and bump-bonding.

In one such embodiment, the first contact layer is on an etch stop layer, which is on a substrate that is transparent to infrared light. The first contact layer can also be on an etch stop layer that that was grown on a substrate layer which was subsequently removed, thereby improving imaging capability of the device. In another such embodiment, the layers of the device are formed on a substrate that is subsequently removed to enable improved imaging capability, and the metal contacts are adapted to a common planar surface, thereby enabling bump-bonding to the read-out circuit. In another such embodiment, the first contact layer has a second surface opposite the surface having its metal contact, and the device further includes: a third contact layer having a metal contact on its surface; a third barrier layer on the surface of the third contact layer having the metal contact; a second doped quantum dot layer on the third barrier layer, the second doped quantum dot layer configured with a plurality of quantum dots, each dot having a size that is sensitive to a second color; and a fourth barrier layer between the second doped quantum dot layer and the second surface of the first contact layer.

Another embodiment of the present invention provides a method of manufacturing a QDIP FPA device for generating infrared images. The method includes the following: growing a first contact layer; growing a first barrier layer on the first contact layer; growing a doped quantum dot layer on the first barrier layer, the doped quantum dot layer configured with a plurality of quantum dots, each dot having a size that is sensitive to a first color; growing a second barrier layer on the doped quantum dot layer; growing a second contact layer on the second barrier layer; and bump-bonding a read-out circuit to the grown structure, so as to enable electrical signals produced by the doped quantum dot layer to be correlated to intensity of sensed light, thereby allowing for the generation of infrared images. The method may further include repeating the growing of the first barrier layer, the doped quantum dot layer, and the second barrier layer a number of times prior to growing the second contact layer.

In one such embodiment, the method further includes growing an etch stop layer on a substrate that is transparent to infrared light, wherein the first contact layer is grown on the etch stop layer. In another such embodiment, the method further includes growing an etch stop layer on a substrate, wherein the first contact layer is grown on the etch stop layer; and after bump-bonding the grown structure to the read-out circuit, removing the substrate. In any event, removing the substrate enables improved imaging capability. The method may further include adapting metal contacts of the contact layers to a common planar surface. This will facilitate flip-chip bump-bonding to the read-out circuit. In another particular embodiment, prior to growing the first contact layer, the method further includes: growing a third contact layer; growing a third barrier layer on the third contact layer; growing a second doped quantum dot layer on the third barrier layer, the second doped quantum dot layer configured with a plurality of quantum dots, each dot having a size that is sensitive to a second color; and growing a fourth barrier layer between the second doped quantum dot layer and the second surface of the first contact layer.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

BRIEF DESCRIPTION OF THE DRAWINGS

FIG. 3b is a top view structural diagram of the two-color QDIP array shown in FIG. 3a.

DETAILED DESCRIPTION OF THE INVENTION

As previously explained, a QD forms an attractive potential for the electrons which confines the electrons in 3-dimensions. Since QD size is on the order of the electron wavelength, this confinement leads to discrete energy levels of the electron, associated with the size of the dot and the strength of the attractive potential (depth of the potential) hole within the semiconductor crystal structure. Photons incident on the crystal structure with the QDs are absorbed if they have the energy (wavelength) corresponding to the separation of the ground and first (or higher) excited energy state.

Therefore it is possible to "tune" the wavelength response of a QD by changing the size of the dot and/or the depth of the hole, by choice of the material. In this sense, a QD can be configured to detect a certain color of the target spectrum. An electric field applied to the QDs sweeps the excited electrons off of the dot, and the change in current is measured thereby detecting the light.

Embodiments of the present invention provide a two-dimensional array of QDIPs. The QDIP array is bump bonded to a read-out circuit (e.g., Si CMOS chip) to provide a robust QDIP imaging focal plane array (IFPA). The resulting device enables the generation of IR images that could be used, for example, in surveillance, military (e.g., night vision), and search and rescue applications. Conventional photolithography and hybridization techniques can be used to fabricate the QDIP IFPA. The read-out circuit can be adapted to integrate, store, amplify, and perform image processing of the electrical signals generated by the QDIP array.

QDIP Imaging Focal Plane Array Structure

The QDIP imaging focal plane array can be fabricated, for example, from a wafer that is processed using photolithography to provide the shown structure. The resulting two dimensional array can have numerous configurations, such as a 320×256 array, a 640×480 array, a 600×800 array, or a 1024×768 array. Ultimately, the configuration will depend on the particular imaging application. Such a single-color QDIP IFPA can be electrically addressed through hybridization to a CMOS driver (or other suitable electronic processing circuitry) to produce an image that could be stored and/or displayed with appropriate digital or analog electronics.

Structural schematics for both the single-color and two-color QDIP IFPAs will now be discussed in reference to FIGS. 1 and 2, respectively. Both use quantum dot epi growths that are processed into an FPA using photolithography. Epi growths can be designed or "tuned" to respond at specific wavelengths of interest by varying dot size and surrounding material composition. Thus, depending on the tuning of the quantum dot epi growths, one or more colors can be detected by the QDIP IFPA.

Single-color QDIP IFPA

Figure 1:
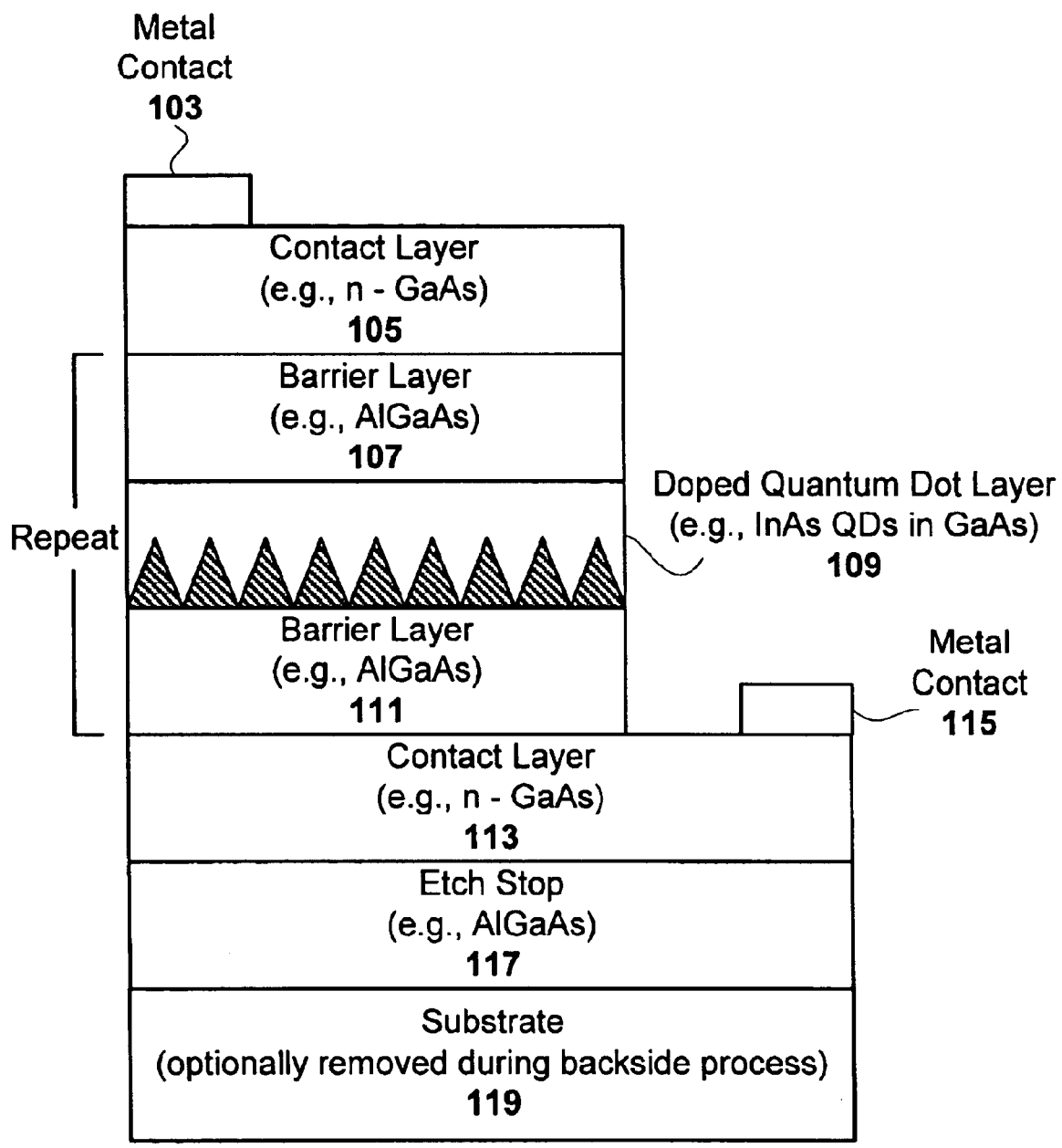
FIG. 1 is a structural diagram illustrating a single-color QDIP array configured in accordance with one embodiment of the present invention.

FIG. 1 is a structural diagram illustrating a single-color QDIP array configured in accordance with one embodiment of the present invention. As can be seen, the structure includes a number of stacked layers including substrate 119, etch stop 117, contact 115, contact layer 113, barrier layer 111, doped QD layer 109, barrier layer 107, contact layer 105, and contact 103. Note that the barrier layer 111, doped QD layer 109, and barrier layer 107 can be repeated a number of times to provide a stacked QD growth sensitive to a particular color.

The common of the QDIP array is provided at contact 103, while the output signal of the single-color sensing QD growth is provided at contact 115.

In this particular embodiment, the contact layers 105 and 113 are each an n-GaAs layer. The barrier layers 107 and 111, as well as the etch stop layer 117, are each AlGaAs layers. The substrate can be a GaAs or other infrared transparent substrate material. The quantum dots of the QD layer 109 are InAs in GaAs. The contacts 103 and 115 can each be Au, or other suitable conductor.

Example layer characteristics are as follows: contact layers 105 and 113: 13000 Å $1\times10^{18}$ n-doped; barrier layers 107 and 111: 43 Å $Al_{0.30}Ga_{0.70}As$; etch stop layer 117: 1000 Å $Al_{0.50}Ga_{0.50}As$; substrate 119: Si GaAs; and contacts 103 and 115: 13000 Å $1\times10^{18}$ n-doped. The QD layer 109 thickness would be governed by the grower such that the QD size would correspond to the proper wavelength response. Note that QD size depends on more than just the layer thickness (such as growth temperatures and elemental partial pressures). An approximate QD size of 40 nm should respond to 10 $\mu$m light. Modeling the dots as spheres, the allowed energy levels are solutions to $$kR_0\cot(kR_0) = 1 - \frac{m_{InAs}}{m_{GaAs}}(1 + \kappa R_0),$$

$$\text{where } k^2 = \frac{2m_{InAs}(\Delta V + E)}{\hbar^2}, \quad \kappa^2 = -\frac{2m_{GaAs}E}{\hbar^2},$$

$m_{InAs}$ and $m_{GaAs}$ are the effective masses of the electron for InAs and GaAs respectively, and $\Delta V$ is the difference in the band gaps of the two materials.

Note that the materials here are not necessarily the materials that have to be used, but show the form of the material growth. Moreover, the quantum dots can be doped with either carrier type or left as an intrinsic material depending on wavelength or dark current characteristics that are desired. Further note that layer dimensions will depend on the particular application, including factors such as desired wavelength. Conventional epi growth processing can be used in the fabrication of QDIP array configured in accordance with the principles of the present invention.

Two-color QDIP IFPA

Figure 2:
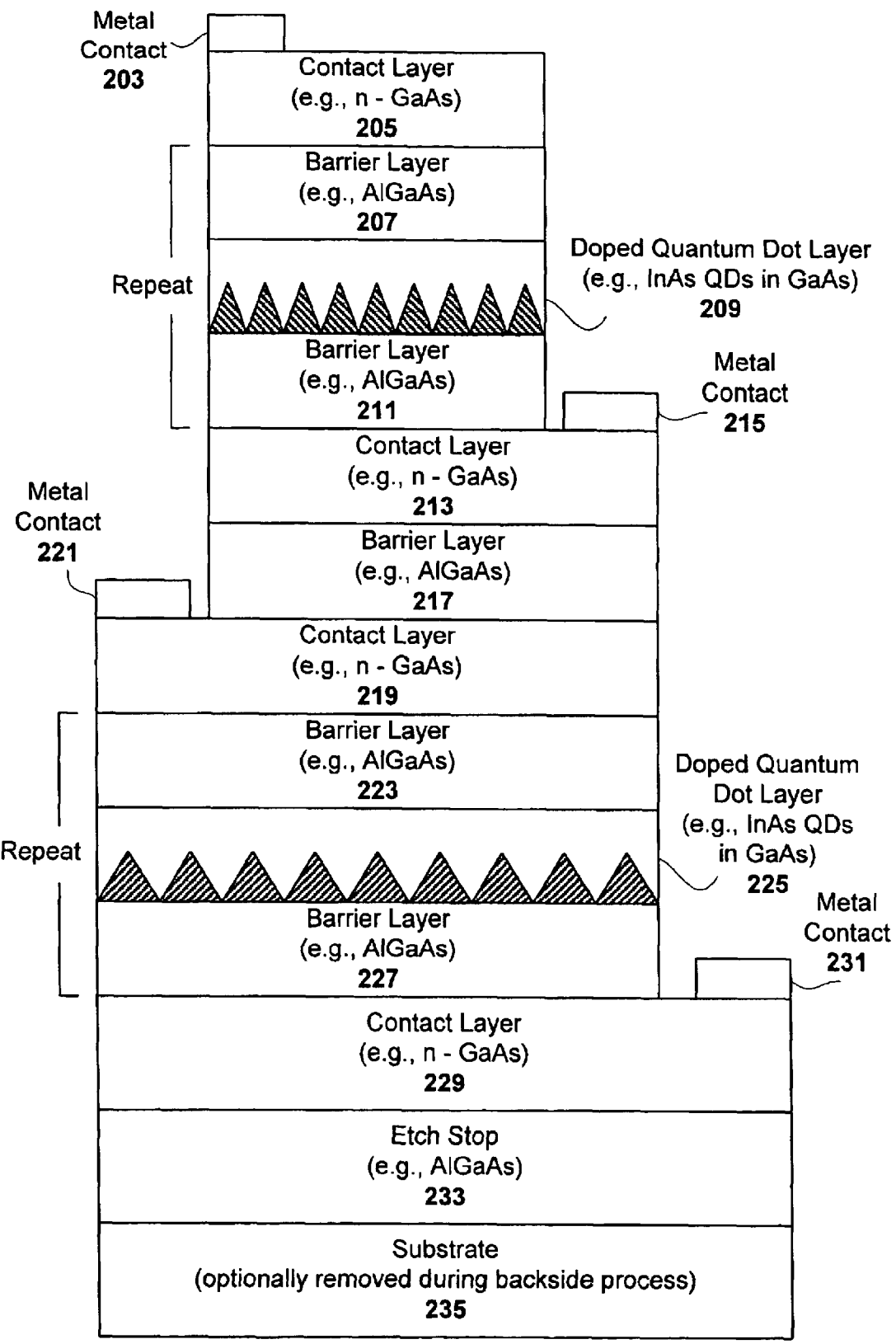
FIG. 2 is a structural diagram illustrating a two-color QDIP array configured in accordance with another embodiment of the present invention.

FIG. 2 is a structural diagram illustrating a two-color QDIP array configured in accordance with one embodiment of the present invention. Here, the structure includes a substrate 235, etch stop 233, contact 231, contact layer 229, barrier layer 227, doped QD layer 225, barrier layer 223, contact layer 219, barrier layer 217, contact 215, contact layer 213, barrier layer 211, doped QD layer 209, barrier layer 207, contact layer 205, and contact 203.

Note that the barrier layer 211, doped QD layer 209, and barrier layer 207 can be repeated a number of times to provide stacked QD growths sensitive to a first color. Further note that the barrier layer 227, doped QD layer 225, and barrier layer 223 can be repeated a number of times to provide stacked QD growths sensitive to a second color. In short, each QD growth formed in the structure can be tuned to a specific wavelength (whether the same as other QD growths or different).

The common of the QDIP array is provided at contacts 203 and 221, while the output signal of the first color sensing QD growth is provided at contact 215, and the output signal of the second color sensing QD growth is provided at contact 231.

In this example, the contact layers 205, 213, 219, and 229 are each an n-GaAs layer. The barrier layers 207, 211, 217, 223, and 227 as well as the etch stop layer 233, are each AlGaAs layers. The substrate 235 can be a GaAs or other infrared transparent substrate material. The quantum dots of the QD layers 209 and 225 are InAs in GaAs. The contacts 203, 221, and 231 can each be Au, or other suitable conductor. The previous discussion in reference to FIG. 1 relevant to the materials, doping, and layer dimensions equally applies here. In this particular embodiment, the quantum dots of the QD layer 209 are approximately 35 nm in diameter to provide a sensitivity to wavelengths in the range of 8 microns. The quantum dots of the QD layer 225 are approximately 40 nm in diameter to provide a sensitivity to wavelengths in the range of 10 microns.

It will be appreciated that the structures illustrated in FIGS. 1 and 2 can readily be extended so as to form QDIP IFPAs capable of sensing any number of colors (e.g., 3 or more).

Substrate Removal for Improved Imaging

Further enhancement of the images formed by the QDIP IFPA described herein can be achieved through the removal of the device's substrate, using conventional back-side processing techniques. Removing the substrate allows more light to pass to the QD layers. In addition, pixel cross-talk is reduced, thereby allowing crisper images to be formed, and avoiding halos and other focusing related problems. In general, pixel cross-talk is caused by the reflection of light between the etch stop layer 117/233 and the substrate 119/235.

In one particular embodiment, the substrate is removed using both mechanical and chemical processes. For instance, the bulk of the substrate (e.g., 500 to 600 microns) can be mechanically removed by using a grit solution, such a 3 micron aluminum grit in water. Numerous such abrasion schemes can be employed here as well. The remainder of the substrate can then be removed with plasma or dry etch processing, thereby exposing the optically flat surface of the etch stop layer 117.

Typically, the substrate should be removed after hybridization, because only the epi remains (e.g., about 4 microns thick) once the substrate is removed. However, various configurations are possible in light of this disclosure, and some embodiments may allow substrate removal prior to hybridization. Thus, the timing of the substrate removal process will generally depend on the particular application, including factors such as the device robustness.

Hybridization

Figure 3C:
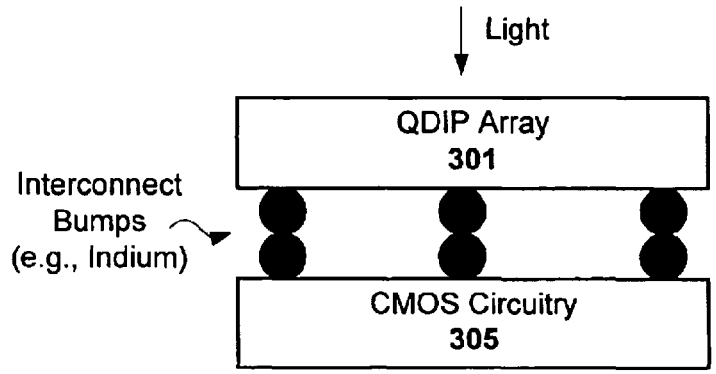
FIG. 3c is a side view structural diagram of the two-color QDIP array shown in FIGS. 3a and 3b.
Figure 3B:
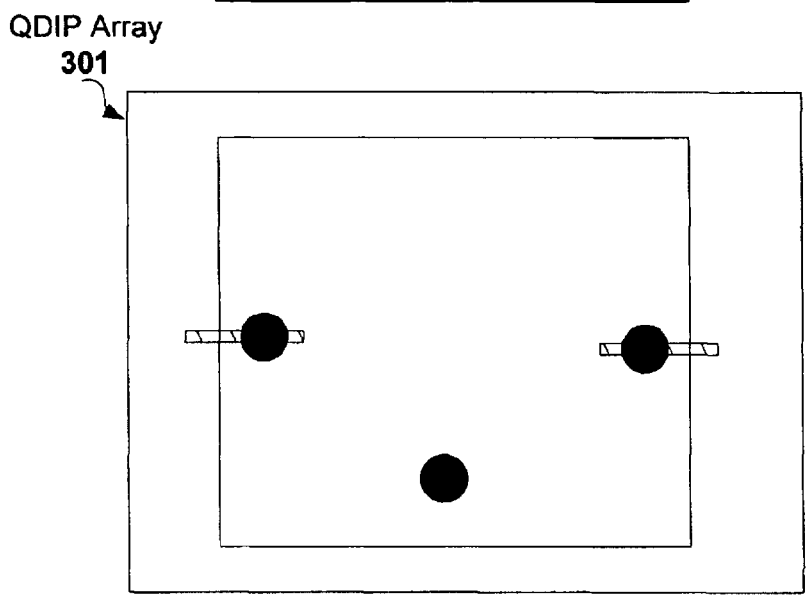
Figure 3A:
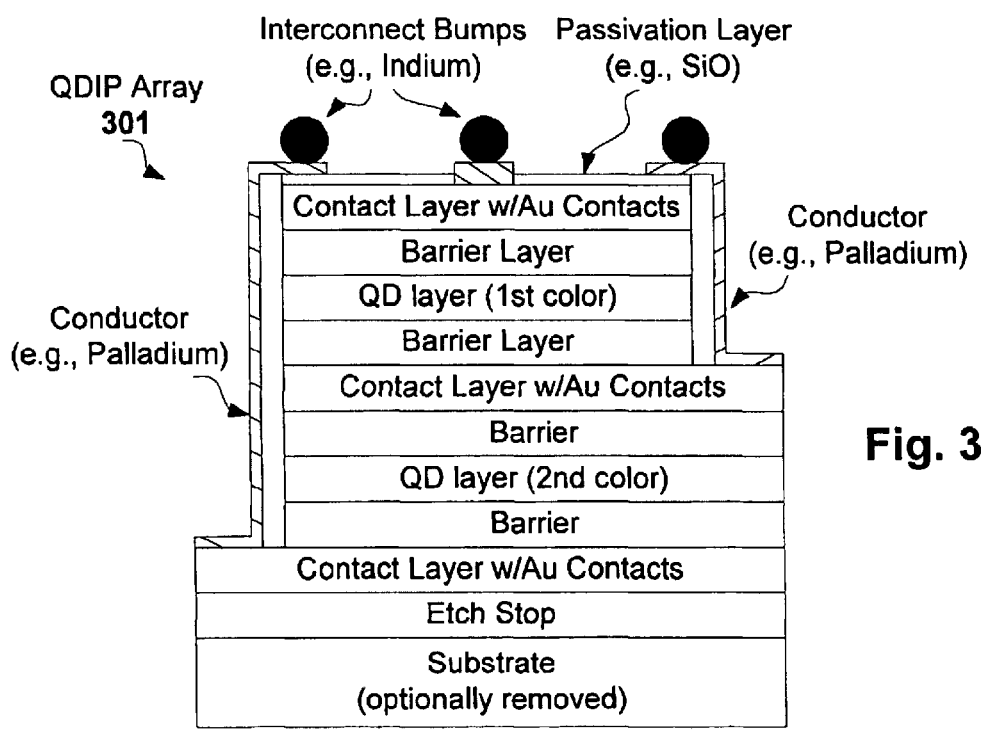
FIG. 3a is a structural diagram illustrating the hybridization of a two-color QDIP array to CMOS circuitry in accordance with an embodiment of the present invention.

FIG. 3a is a structural diagram illustrating the hybridization of a two-color QDIP array to CMOS circuitry in accordance with an embodiment of the present invention. Here, a two-color QDIP array 301 is bump-bonded to a CMOS circuitry chip 305. The interconnect bumps can be, for example, Indium (In) or another suitable bump-bonding materials.

FIG. 3b is a top view structural diagram of the two-color QDIP array 301 shown in FIG. 3a. Assume that the middle bump is the QDIP common, and the two outer bumps are each electrically and mechanically connected to respective lower layer contacts, which each provide access to an output of a corresponding color sensing QD growth.

FIG. 3c is a side view structural diagram of the two-color QDIP array shown in FIGS. 3a and 3b. The QDIP array structure is similar to the example illustrated in FIG. 2, except that there is only one common metal contact pad provided, thereby eliminating a metal contact and its associated contact and barrier layers. Here, one QD growth is positively biased with respect to the array common, and the other QD growth is negatively biased with respect to the array common. Such complementary biasing operates to reduce noise in the common plane.

In this example, the interconnect bumps are In, the metal contacts are Au, and the conductors electrically and mechanically coupling the contact to the interconnect bumps are palladium. In this sense, the metal contacts are adapted to a common planar surface to enable bump-bonding. The contact layers can each be an n-GaAs layer. The barrier and etch stop layers can each be AlGaAs, and the substrate can be a GaAs or other infrared transparent substrate material. The quantum dots of the QD layers can be InAs in GaAs. Other configuration will be apparent in light of this disclosure, and the present invention is not intended to limited to any one such embodiment.

Once the QDIP array 301 and the CMOS circuitry chip 305 are fabricated, they can be pressed together (with their individual bumps aligned) so that flexible, bonding bumps or interconnects are formed between the respective surfaces of the QDIP array 301 and the CMOS circuitry chip 305.

The force at which the two are pressed together will depend on factors such as the number of connection points, the area of each bump, and the amount of Indium (whether 100% Indium or an alloy). A force in the range of several Kilograms will generally cause sufficient adhesion between the QDIP array 301 and the CMOS circuitry chip 305 given 100% Indium bumps. Appropriate Indium alloys generally require less force. Note that an equal or better opposing force is required to break the connection. Each bump can, for example, have a diameter in the range of about $1/10000^{th}$ to $1/100^{th}$ of an inch, and a height in the range of about $1/10000^{th}$ to $2/1000^{th}$ of an inch.

Figure 4:
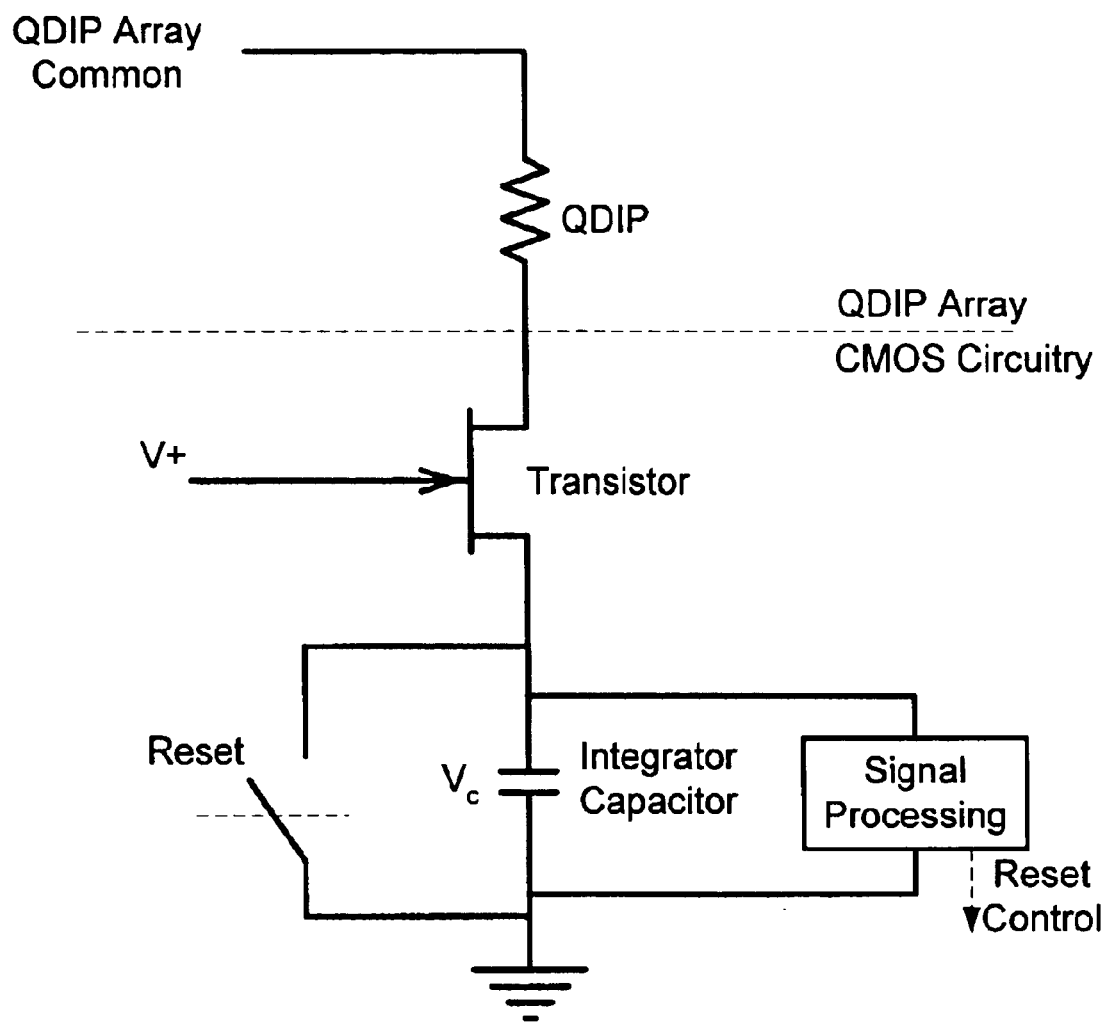
FIG. 4 is an electrical schematic diagram of a low current read-out circuit for a QDIP configured in accordance with embodiments of the present invention.

FIG. 4 is an electrical schematic diagram of a low current read-out circuit for a QDIP configured in accordance with embodiments of the present invention. Generally, the read-out circuit can be adapted to integrate, store, amplify, and perform image processing of the electrical signals generated by the QDIP array.

Light incident upon the QDIP (symbolically represented here as a resistor) causes the voltage level output by the QDIP to increase. This increasing voltage is applied to the source of the transistor. When the voltage level applied at the source is higher than V+ applied at the gate, the transistor turns on and the sensed signal is provided to the integration capacitor, where the charge is collected and measured after an exact amount of time.

The collected charge can then be processed (e.g., filtered, amplified, correlated to intensity, or otherwise interrogated) by the signal processing module. As the amount of charge time, the value of the integration capacitor, and the measured charge are known, a corresponding intensity can be calculated. A reset switch is provided across the integration capacitor, which allows the capacitor to be discharged in preparation for receiving a new image signal.

The signal processing module can be implemented in conventional technology, such as a programmable microcontroller configured with I/O ports (e.g., to output reset control signals and to sense voltage across the integration capacitor), memory (e.g., for storing the measured charges and charge time), a CPU, and a number of processes (e.g., reset routine, measure Vc routine, and voltage-to-intensity correlation routine).

The hybridization of a QDIP array to Si CMOS read-out circuitry (or other suitable read-out circuitry) thus enables the generation of an IR image that could be used for applications such as surveillance, night vision, and search and rescue operations.

The foregoing description of the embodiments of the invention has been presented for the purposes of illustration and description. It is not intended to be exhaustive or to limit the invention to the precise form disclosed. Many modifications and variations are possible in light of this disclosure. It is intended that the scope of the invention be limited not by this detailed description, but rather by the claims appended hereto.

What is claimed is:

1. A quantum dot infrared photodetector focal plane array (QDIP FPA) for generating infrared images, the device comprising:
    a first contact layer having a metal contact on its surface;
    a first barrier layer on the surface of the first contact layer having the metal contact;
    a first doped quantum dot layer on the first barrier layer, the first doped quantum dot layer configured with a plurality of quantum dots, each dot having a size that is sensitive to a first color;
    a second barrier layer on the first doped quantum dot layer;
    a second contact layer on the second barrier layer, the second contact layer having a metal contact on its surface;
    a third barrier layer on the surface of the second contact layer having the metal contact;
    a second doped quantum dot layer on the third barrier layer, the second doped quantum dot layer configured with a plurality of quantum dots, each dot having a size that is sensitive to a second color;
    a fourth barrier layer on the second doped quantum dot layer;
    a third contact layer on the fourth barrier layer, the third contact layer having a metal contact on its surface; and
    a read-out circuit that is electrically coupled to each of the metal contacts and adapted to correlate electrical signals produced by the doped quantum dot layers to intensity of sensed light, thereby allowing for the generation of infrared images.

2. The device of claim 1 wherein the first contact layer is on an etch stop layer, which is on a substrate that is transparent to infrared light.

3. The device of claim 1 wherein the first contact layer is on an etch stop layer grown on a substrate layer which was subsequently removed, thereby improving imaging capability of the device.

4. The device of claim 1 wherein the first barrier layer, the first doped quantum dot layer, and the second barrier layer are repeated a number of times prior to adding the second contact layer.

5. The device of claim 1 wherein the layers of the device are formed on a substrate that is subsequently removed to enable improved imaging capability, and the metal contacts are adapted to a common planar surface, thereby enabling bump-bonding to the read-out circuit.

6. The device of claim 1 wherein the layers of the device are formed, and the metal contacts are adapted to a common planar surface, thereby enabling bump-bonding to the read-out circuit.

7. The device of claim 1 wherein the device is fabricated using both epi-growth processing and bump-bonding.

8. The device of claim 1 wherein one of the contact layers provides an array common, and one of the doped quantum dot layers is positively biased with respect to the array common, and the other doped quantum dot layer is negatively biased with respect to the array common.

9. The device of claim 1 wherein the third barrier layer, the second doped quantum dot layer, and the fourth barrier layer are repeated a number of times prior to adding the third contact layer.

10. A quantum dot infrared photodetector focal plane array (QDIP FPA) for generating infrared images, the device comprising:
    a first stack of quantum dot epi growths sensitive to a first color, and having a first contact layer;
    a second stack of quantum dot epi growths sensitive to a second color, and having a second contact layer;
    at least one common contact layer distinct from the first and second contact layers; and
    a read-out circuit operatively coupled to each of the contact layers, that is adapted to correlate electrical signals produced by the each of the quantum dot epi growths to intensity of sensed light, thereby allowing for the generation of infrared images.

11. The device of claim 10 wherein the first and second quantum dot epi growths are part of a structure formed separately from the read-out circuit, the structure grown on a substrate that was subsequently removed to enable improved imaging capability.

12. The device of claim 10 wherein the first and second quantum dot epi growths are part of a structure formed separately from the read-out circuit, wherein the structure is bump-bonded to the read-out circuit.

13. The device of claim 10 further comprising N additional quantum dot epi growths, with each additional quantum dot growth adapted to sense a unique color, and to provide its output to the read-out circuit.

14. The device of claim 10 wherein the first quantum dot epi growth is positively biased with respect to one of the at least one common contact layers, and the second quantum dot epi growth is negatively biased with respect to one of the at least one common contact layers.

15. A method of manufacturing a quantum dot infrared photodetector focal plane array (QDIP FPA) device for generating infrared images, the method comprising:

growing a first contact layer;

growing a first barrier layer on the first contact layer;

growing a first doped quantum dot layer on the first barrier layer, the first doped quantum dot layer configured with a plurality of quantum dots, each dot having a size that is sensitive to a first color;

growing a second barrier layer on the first doped quantum dot layer;

growing a second contact layer on the second barrier;

growing a third barrier layer on the second contact layer;

growing a second doped quantum dot layer on the third barrier layer, the second doped quantum dot layer configured with a plurality of quantum dots, each dot having a size that is sensitive to a second color;

growing a fourth barrier layer on the second doped quantum dot layer;

growing a third contact layer on the fourth barrier layer; and bump-bonding a read-out circuit to the grown structure, so as to enable electrical signals produced by the doped quantum dot layers to be correlated to intensity of sensed light, thereby allowing for the generation of infrared images.

16. The method of claim 15 further comprising:

growing an etch stop layer on a substrate that is transparent to infrared light, wherein the first contact layer is grown on the etch stop layer.

17. The method of claim 15 further comprising:

growing an etch stop layer on a substrate, wherein the first contact layer is grown on the etch stop layer; and after bump-bonding the grown structure to the read-out circuit, removing the substrate.

18. The method of claim 15 further comprising:

repeating the growing of the first barrier layer, the first doped quantum dot layer, and the second barrier layer a number of times prior to growing the second contact layer.

19. The method of claim 15 wherein the layers of the device are grown on a substrate, the method further comprising:

removing the substrate to enable improved imaging capability.

20. The method of claim 15 further comprising:

adapting metal contacts of the contact layers to a common planar surface.

* * * * *